United States Patent
Anderson et al.

(10) Patent No.: US 10,324,714 B2
(45) Date of Patent: Jun. 18, 2019

(54) APPARATUS AND METHOD FOR TRIMMING PARAMETERS OF ANALOG CIRCUITS INCLUDING CENTRALIZED PROGRAMMABLE ALU ARRAY

(71) Applicant: QUALCOMM Incorporated, San Diego, CA (US)

(72) Inventors: Michael Anderson, Leucadia, CA (US); Gunjan Upadhyay, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 69 days.

(21) Appl. No.: 15/603,261

(22) Filed: May 23, 2017

(65) Prior Publication Data

US 2018/0341478 A1    Nov. 29, 2018

(51) Int. Cl.
| | |
|---|---|
| *G06F 9/30* | (2018.01) |
| *G06F 12/06* | (2006.01) |
| *G11C 29/02* | (2006.01) |
| *G11C 7/04* | (2006.01) |
| *G11C 29/44* | (2006.01) |

(52) U.S. Cl.
CPC ........ *G06F 9/3001* (2013.01); *G06F 9/30043* (2013.01); *G06F 9/30101* (2013.01); *G06F 12/0646* (2013.01); *G11C 7/04* (2013.01); *G11C 29/028* (2013.01); *G06F 2212/1008* (2013.01); *G06F 2212/1032* (2013.01); *G11C 2029/4402* (2013.01)

(58) Field of Classification Search
None
See application file for complete search history.

(56) References Cited

U.S. PATENT DOCUMENTS

| | | | |
|---|---|---|---|
| 5,666,118 A | 9/1997 | Gersbach | |
| 5,796,312 A * | 8/1998 | Hull | G06F 1/08 331/44 |
| 6,313,769 B1 * | 11/2001 | Mangahas | H03M 1/1019 341/118 |

(Continued)

OTHER PUBLICATIONS

Partial International Search Report—PCT/US2018/033969—ISA/EPO—dated Oct. 19, 2018.

(Continued)

*Primary Examiner* — Eric Coleman
(74) *Attorney, Agent, or Firm* — Loza & Loza, LLP/Qualcomm

(57) ABSTRACT

Apparatus and method are described for trimming parameters of analog circuits. The apparatus includes trim result registers for storing trim results for adjusting parameters of analog circuits, respectively; a memory device configured to store sets of operands; and a trim calculation unit configured to generate the set of trim results by performing a set of arithmetic operations on the sets of operands based on a set of commands, respectively. The trim calculation unit receives a set of commands; transfers sets of operands from the memory device to a programmable ALU array based on the set of commands, respectively; generates trim results by performing arithmetic operations on the sets of operands based on the set of commands, respectively; and sends the trim results to the trim result registers based on the set of commands, respectively.

18 Claims, 8 Drawing Sheets

(56) References Cited

U.S. PATENT DOCUMENTS

| | | | |
|---|---|---|---|
| 6,446,019 B1 | 9/2002 | Kynett et al. | |
| 6,525,616 B1* | 2/2003 | Williams | H03L 7/08 |
| | | | 327/159 |
| 6,557,092 B1* | 4/2003 | Callen | G06F 15/7867 |
| | | | 326/38 |
| 7,378,999 B1* | 5/2008 | McGrath | H03M 1/1028 |
| | | | 341/120 |
| 7,607,036 B1 | 10/2009 | Sutor et al. | |
| 7,812,665 B2* | 10/2010 | Eschauzier | H03F 3/45753 |
| | | | 327/124 |
| 8,374,282 B2* | 2/2013 | Szopko | H03F 1/30 |
| | | | 375/289 |
| 8,710,898 B1 | 4/2014 | Chiang et al. | |
| 9,349,472 B2 | 5/2016 | Yoo et al. | |
| 2003/0160713 A1* | 8/2003 | Kuyel | H03M 1/1047 |
| | | | 341/120 |
| 2007/0140023 A1 | 6/2007 | Helfer et al. | |
| 2009/0063081 A1 | 3/2009 | Xu et al. | |
| 2009/0241083 A1* | 9/2009 | Olgiati | G06F 17/5072 |
| | | | 716/119 |
| 2010/0007392 A1* | 1/2010 | Hsu | H03L 1/00 |
| | | | 327/160 |
| 2015/0149121 A1* | 5/2015 | Ahmed | G06F 3/06 |
| | | | 702/190 |
| 2015/0249453 A1* | 9/2015 | Harrington | G01R 23/02 |
| | | | 331/44 |

OTHER PUBLICATIONS

International Search Report and Written Opinion—PCT/US2018/033969—ISA/EPO—dated Dec. 19, 2018.

* cited by examiner

| t_write_addr | e_write_addr | e_block_size | g_write_addr | ALU CNTL | RESULT ADDR |
|---|---|---|---|---|---|
| t_addr_1 | e_addr_1 | 1 | NULL | PROGRAM 1 | r_addr_1 |
| t_addr_2 | e_addr_2 | 6 | g_addr_1 | PROGRAM 3 | r_addr_2 |
| t_addr_3 | e_addr_3 | 1 | NULL | PROGRAM 1 | r_addr_3 |
| ⋮ | ⋮ | ⋮ | ⋮ | ⋮ | ⋮ |
| t_addr_j | e_addr_j | 3 | g_addr_2 | PROGRAM 2 | r_addr_j |

US 10,324,714 B2

APPARATUS AND METHOD FOR TRIMMING PARAMETERS OF ANALOG CIRCUITS INCLUDING CENTRALIZED PROGRAMMABLE ALU ARRAY

BACKGROUND

Field

Aspects of the present disclosure relate generally to trimming parameters of analog circuits, and in particular, to an apparatus and method for trimming parameters of analog circuits using a centralized programmable arithmetic logic unit (ALU) array.

Background

An integrated circuit (IC) may include a set of analog circuits. The set of analog circuits may include a set of parameters for adjusting the operations of the set of analog circuits, respectively. In the past, an IC included a set of dedicated calculation blocks and associated registers for performing trimming or adjustments of the set of parameters of the analog circuits. Such dedicated calculation blocks and associated registers generally consume substantial amount of IC area to implement, consume substantial amount of power, are generally not programmable, and are not easy scalable without considerable redesign efforts.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a set of trim result registers configured to store a set of trim results for adjusting a set of parameters of a set of analog circuits, respectively; a memory device configured to store sets of operands associated with the set of trim results, respectively; and a trim calculation unit configured to generate the set of trim results by performing a set of arithmetic operations on the sets of associated operands based on a set of commands, respectively.

Another aspect of the disclosure relates to a method including receiving a set of commands; transferring sets of operands from a memory device to a programmable arithmetic logic unit (ALU) array based on the set of commands, respectively; generating a set of trim results by performing a set of arithmetic operations on the sets of operands by the programmable ALU based on the set of commands, respectively; and sending the set of trim results to a set of trim result registers for adjusting a set of parameters of a set of analog circuits based on the set of trim results, respectively.

Another aspect of the disclosure relates to an apparatus including means for receiving a set of commands; means for transferring sets of operands from a memory device to a programmable ALU array based on the set of commands, respectively; means for generating a set of trim results including means for performing a set of arithmetic operations on the sets of operands based on the set of commands, respectively; and means for sending the set of trim results to a set of trim result registers for adjusting a set of parameters of a set of analog circuits based on the set of trim results, respectively.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Analog circuits, such as radio frequency (RF) and other types of analog circuits, often need slight adjustments in their parameters to optimize circuit performance. For example, an RF amplifier may require adjustment of its gain for improved transmission or reception of signals. A low dropout regulator (LDO) may require adjustment of a reference voltage applied to the LDO to optimize the regulated output voltage generated by the LDO. Such adjustment of analog circuit parameters is often referred to as trimming parameters of analog circuits.

For integrated circuits (ICs) that have many analog circuits, a digital calibration circuit is employed to provide the fine adjustment or trimming of analog circuit parameters. An example of such a digital calibration circuit is discussed below in detail.

Figure 1:
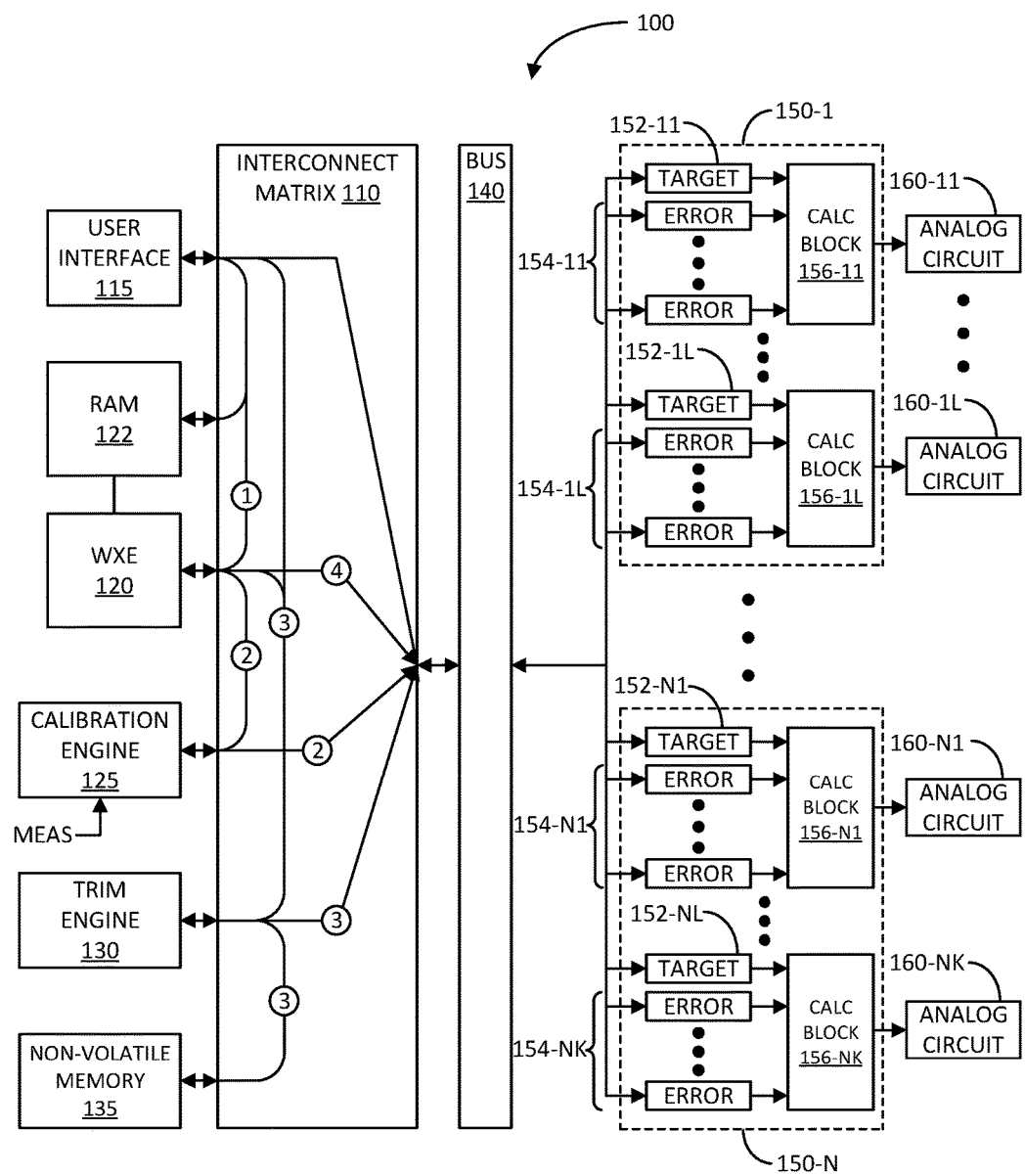
FIG. 1 illustrates a block diagram of an exemplary apparatus for trimming parameters of analog circuits in accordance with an aspect of the disclosure.

FIG. 1 illustrates a block diagram of an exemplary apparatus 100 for trimming parameters of analog circuits in accordance with an aspect of the disclosure. The apparatus 100 includes an interconnect matrix (ICM) 110, a user interface 115, a write execution unit (WXE) 120 (such as a direct memory access), a random access memory (RAM) 122, a calibration engine 125, a trim engine 130, and a non-volatile memory 135 (e.g., a fuse programmable read only memory (FPROM)).

The ICM 110 is coupled to a set of digital-to-parameter (DTOP) devices 150-1 to 150-N via a digital bus 140 (e.g., a peripheral interface bus (PIB)). The set of DTOP circuits 150-1 to 150-N are coupled to analog circuits 160-11/160-1L to 160-N1/160-NK, respectively.

The DTOP circuits 150-1 to 150-N include a set of target registers 152-11/152-1L to 152-N1/152-NK, a set of error (calibration) registers 154-11/154-1L to 154-N1/154-NK, and a set of calculation blocks (e.g., static arithmetic logic unit (ALU)) blocks 156-11/156-1L to 156-N1/156-NK.

Each of the target registers stores a target value or data for a corresponding calculation block that provides a default target value for the associated analog circuit parameter. Each of the error registers store an error (calibration) value or data for the corresponding calculation block based on a calibration procedure for modifying the target value in order to optimize the performance of the corresponding analog circuit. Each of the calculation blocks performs a predefined arithmetic operation on the corresponding target and one or more error values to generate a corresponding trim result. The result sets the corresponding parameter of the corresponding analog circuit. An update to one or more of the target and/or error values causes the corresponding calculation block to generate a new trim result.

In operation, the user interface 115 (e.g., which may be a software interface for a user) provides an initiating command (1) to the WXE 120 to cause the WXE 120 to read out target data from the RAM 122 and write the target data to the target registers 152-11/152-1L to 152-N1/152-NK of the DTOP circuits 150-1 to 150-N via the bus 140, respectively. As shown, the user interface 115 may have direct access to the RAM 122 as it may write and read target and other data to and from the RAM 122 without going through the WXE 120. Upon receiving the target data, the calculation blocks 156-11/156-1L to 156-N1/156-NK generate trim results for the analog circuits 160-11/160-1L to 160-N1/160-NK, respectively.

During testing or calibration, the calibration engine 125 receives the target data (2) from the RAM 122 via the WXE 120, receives performance measurements of the analog circuits 160-11/160-1L to 160-N1/160-NK based on the target data in target registers 152-11/152-1L to 152-N1/152-NK, and writes error data (2) into the error registers 154-11/154-1L to 154-N1/154-NK via the ICM 110 and bus 140 in order to optimize the performance of the analog circuits 160-11/160-1L to 160-N1/160-NK, respectively. Upon receiving the error data, the calculation blocks 156-11/156-1L to 156-N1/156-NK generate trim results for the analog circuits 160-11/160-1L to 160-N1/160-NK, respectively. The process of performing measurements, generating new error data, and writing the error data to the error registers may be repeated as needed to achieve a desired performance for the analog circuits 160-11/160-1L to 160-N1/160-NK.

Once the calibration procedure is complete, the trim engine 130 collects all of the final error data (3) from the error registers 154-11/154-1L to 154-N1/154-NK, organizes the error data in a very efficient manner, and burns the error data (3) in the non-volatile memory 135. The trim engine 130 also reads the error data from the non-volatile memory 135 and writes the values into the error registers 154-11/154-1L to 154-N1/154-NK as required.

During operational mode (e.g., non-calibration mode), the user interface 115 may provide new target data (4) for any one or more of the DTOPs 150-1 to 150-N optionally via the WXE 120. In response to receiving a new target data in a target register, the corresponding calculation block generates a trim result for the corresponding analog circuit. As discussed below in detail, each of the calculation blocks are configured to perform combinational calculations within one (1) or a few number of clock cycles so that the effect on the corresponding analog circuit takes place immediately. New target data may be sequentially written into the target registers, and the corresponding calculation blocks generate the trim results sequentially in response thereto.

The calibration engine 125 may also be reinitiated to perform new measurements and generate new error data. Similarly, when error data is written into an error register, the corresponding calculation block generates a trim result for the corresponding analog circuit within or a few number of clock cycles so that the effect takes place immediately. The trim engine 130 may respond to the new error data by writing them into the non-volatile memory 135 and reading them from the memory so that they may be rewritten into the error registers as needed.

Figure 2:
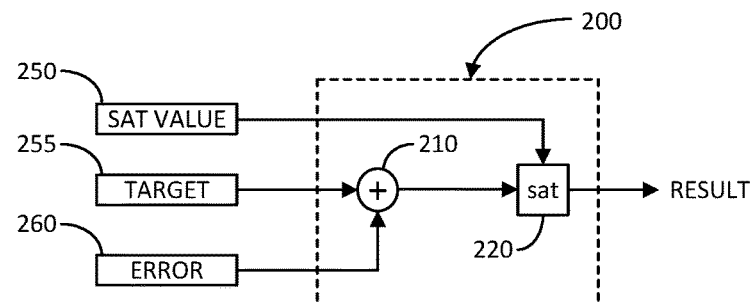
FIG. 2 illustrates a block diagram of an exemplary calculation block in accordance with another aspect of the disclosure.

FIG. 2 illustrates a block diagram of an exemplary calculation block 200 in accordance with another aspect of the disclosure. It shall be understood that the calculation block 200 is merely an example, and calculation blocks as referred to herein may vary substantially based on the trim requirement for the corresponding analog circuit. The calculation block 200 may be an exemplary detailed implementation of one or more of the calculation blocks 156-11/156-1L to 156-N1/156-NK previously discussed.

In particular, the calculation block 200 includes a combinational adder 210 including a first data input coupled to a target register 255 and a second data input coupled to an error register 260. The calculation block 220 includes a data output coupled to a data input of a saturation device 220. The saturation device 220 further includes a control input coupled to a saturation value register 250. The saturation device 200 additionally includes a data output configured to generate a trim result for a corresponding analog circuit.

In this example, the calculation block 200 is configured to modify the target data in register 255 by the error data in register 260. For example, if the error data is zero (0), the adder 210 outputs the target data. If the error data is positive, the adder 210 outputs the target data plus the error data. If the error data is negative, the adder 210 outputs the target data minus the error data. The saturation device 250 bounds the data generated by the adder 210 based on one or more (e.g., upper and lower) saturation values in the register 250. For example, if the data generated by the adder 210 exceeds an upper saturation value, the saturation device 220 outputs the upper saturation value as the trim result. If the data generated by the adder 210 is below a lower saturation value, the saturation device 220 outputs the lower saturation value as the trim result. If the data generated by the adder 210 is neither above the upper saturation value nor below the lower saturation value, the saturation device 220 outputs the data generated by the adder 210.

Figure 3:
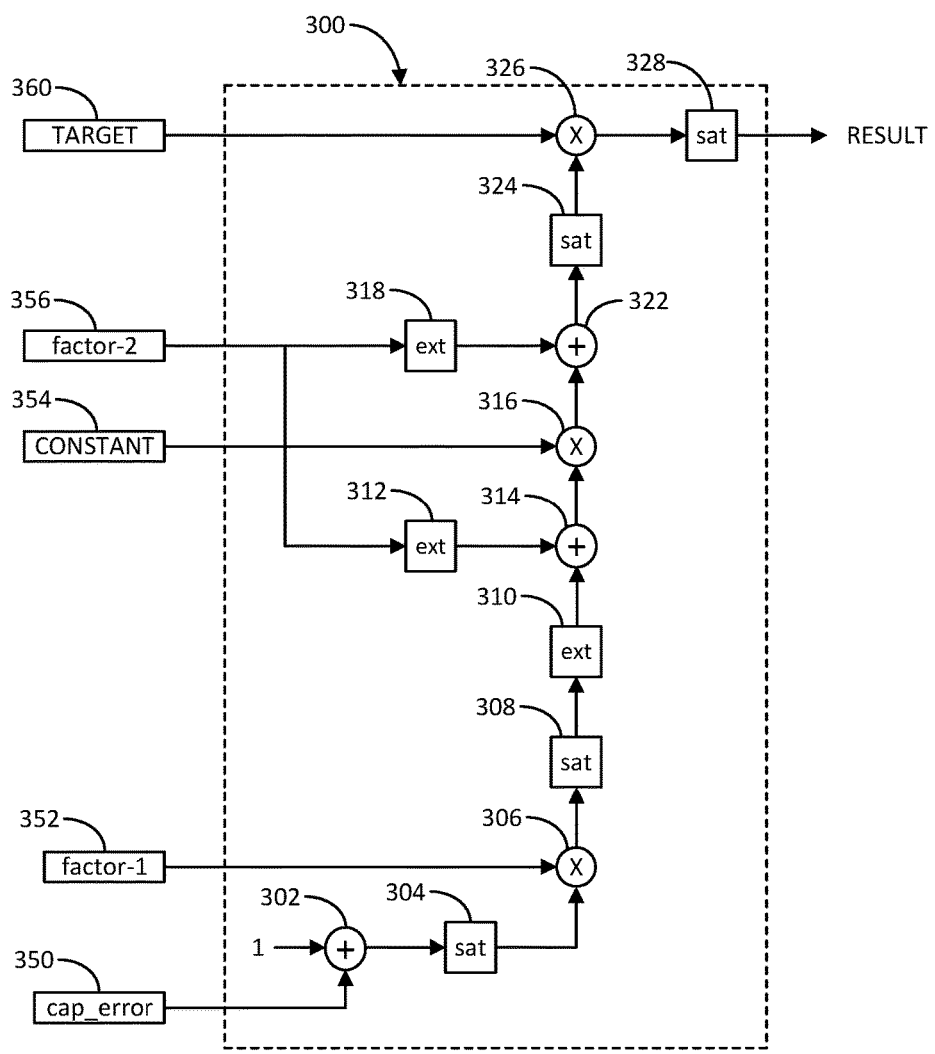
FIG. 3 illustrates a block diagram of another exemplary calculation block in accordance with another aspect of the disclosure.

FIG. 3 illustrates a block diagram of another exemplary calculation block 300 in accordance with another aspect of the disclosure. The calculation block 300 is more complex than the calculation block 200 previously discussed. Again, it shall be understood that the calculation block 300 is merely an example, and calculation blocks as referred to herein may vary substantially based on the trim requirement for the corresponding analog circuit. The calculation block 300 may also be an exemplary detailed implementation of one or more of the calculation blocks 156-11/156-1L to 156-N1/156-NK previously discussed.

In this example, the calculation block 300 is configured to generate a trim result pursuant to the following equation:

RESULT=TARGET*((1+cap_error)*$f1+f2$)*$K+f2$)

Where f1 is a multiplication factor, f2 is an addition factor, K is a constant, and cap_error is a tolerance error of a capacitor that affects the trim result for a corresponding analog circuit.

To implement the aforementioned arithmetic operation, the calculation block 300 includes a first combinational adder 302 configured to generate the (1+cap_error) portion of the equation. In this regard, the first combinational adder 302 including a first input coupled to register 350 for receiving the cap_error data, a second input configured to receive the value one (1), and an output configured to produce and provide the (1+cap_error) value to an input of a first saturation device 304. As discussed, the first saturation device 304 bounds the (1+cap_error) value.

The output of the saturation device 304 is coupled to a first input of a first combinational multiplier 306. The first combinational multiplier 306 includes a second input coupled to register 352 for receiving the factor-1 (f1) value, and an output configured to generate the (1+cap_error)*f1 portion of the equation. The output of the first combinational multiplier 306 is coupled to an input of a second saturation device 308. The second saturation device 308 bounds the (1+cap_error)*f1 value. The second saturation device 308 includes an output coupled to an input of a first extension device 310. The first extension device 310 increases the bit-width of the (1+cap_error)*f1 value to ensure proper arithmetic logic downstream. The first extension device 310 includes an output coupled to a first input of a second combinational adder 314.

The calculation block 300 further includes a second extension device 312 including an input coupled to a register 356 for receiving a factor-2 (f2) value. The second extension device 312 is configured to increase the bit-width of the f2 value to ensure proper addition by the second combinational adder 314. The second extension device 312 includes an output coupled to a second input of the second combinational adder 314. The second combinational adder 314 is configured to produce the (1+cap_error)*f1+f2 portion of the equation. The second combinational adder 314 includes an output coupled to a first input of a second combinational multiplier 316.

The second combinational multiplier 316 includes a second input coupled to register 354 for receiving a constant (K) value. The second combinational multiplier 316 is configured to produce the ((1+cap_error)*f1+f2)*K portion of the equation. The second combinational multiplier 316 includes an output coupled to a first input of a third combinational adder 322.

The calculation block 300 further includes a third extension device 318 including an input coupled to register 356 for receiving the f2 value. The third extension device 318 is configured to increase the bit-width of the f2 value to ensure proper addition by the third combinational adder 322. The third extension device 318 includes an output coupled to a second input of the third combinational adder 322. The third combinational adder 322 is configured to output the ((1+cap_error)*f1+f2)*K+f2 portion of the equation. The third combinational adder 322 includes an output coupled to an input of a third saturation device 324.

The third saturation device 324 is configured to bound the ((1+cap_error)*f1+f2)*K+f2 value. The third saturation device 324 includes an output coupled to a first input of a third combinational multiplier 326. The third combinational multiplier 326 includes a second input coupled to a register 360 for receiving a target data. The third combinational multiplier 326 is configured to output the unbounded trim result as per the equation above. The third combinational multiplier 326 includes an output coupled to an input of a fourth saturation device 328. The fourth saturation device 328 is configured to bound the trim result.

A drawback of the trim calculation apparatus 100 is that it typically includes a substantial number of instantiated calculation blocks, such as calculation blocks 200 and 300. There may be a library of calculation blocks, each with a specific arithmetic function. For example, in a particular integrated circuit (IC) that has 484 trim points, 5106 flip-flops are needed to feed 100s of calculation blocks having a total IC area of 13,332.5 um$^2$. Assuming 35 um$^2$ per flip-flop, the total IC area to implement the calculation function is approximately 31,200 um$_2$. Moreover, the more trim points, the more calculation blocks required. Accordingly, this approach is expensive and does not scale well. Logistically, the trim calculation apparatus 100 is cumbersome to develop, deploy, and maintain a library of calculation blocks.

In summary, a trim computation unit (TCU), in the form of an instantaneously programmable array processor and associated circuitry, is used to implement all the arithmetic functions, rather than individual calculation blocks. As discussed in more detail below, the TCU is configured to perform in-line calculations to generate all trim results for the set of analog circuits.

Additionally, all trim related data (e.g., target and error values) is maintained in a RAM rather than registers. This approach will trade the area of all calculation blocks for the area of a programmable array processor with a nominal number (e.g., three (3)) of ALUs, and it will trade the area of all target and error registers associated with generating trim parameters for an area of a random access memory (RAM) large enough to hold all trim related data efficiently.

This approach scales efficiently to additional trim points because only additional RAM and associated mapping logic are needed. In addition, the approach facilitates the implementation of more complex functions, and adjustments of existing functions, with no impact on local digital blocks.

These concepts are explained below with reference to the following exemplary implementations.

Figure 4:
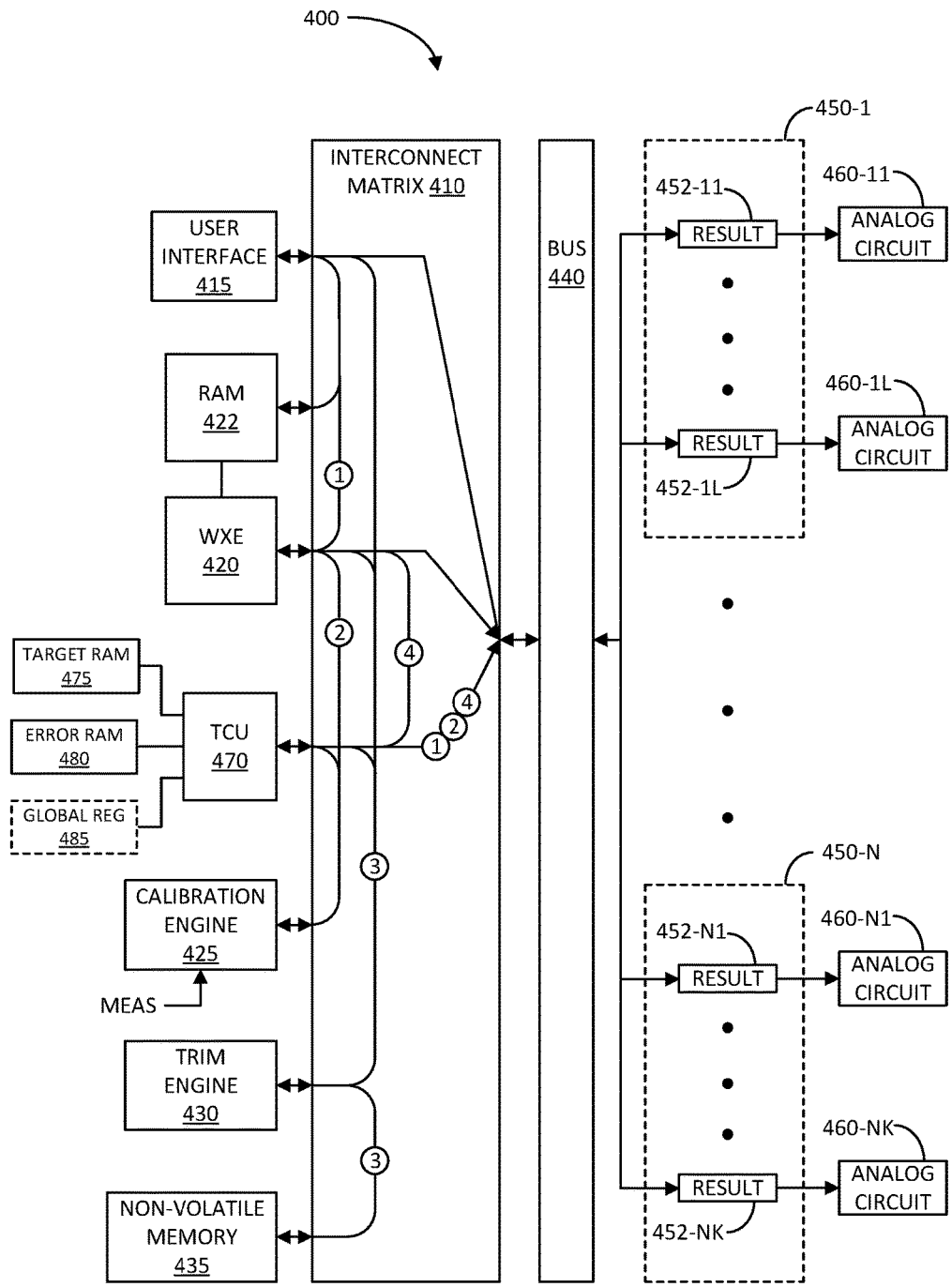
FIG. 4 illustrates a block diagram of another exemplary apparatus for trimming parameters of analog circuits in accordance with another aspect of the disclosure.

FIG. 4 illustrates a block diagram of another exemplary apparatus 400 for trimming parameters of analog circuits in accordance with another aspect of the disclosure. The apparatus 400 includes an interconnect matrix (ICM) 410, a user interface 415 (e.g., a software interface), a write execution unit (WXE) 420 (such as a direct memory access), a random access memory (RAM) 422, a calibration engine 425, a trim engine 430, and a non-volatile memory 435 (e.g., a fuse programmable read only memory (FPROM)).

Additionally, the apparatus 400 includes a trim calculation unit (TCU) 470 with an associated target RAM 475, an error RAM 480, and one or more global registers 485. The one or more global registers 485 may store often used parameters, such as temperature and resistor error data. The user interface 415, RAM 422, WXE 420, TCU 470, calibration engine 425, trim engine 430, and non-volatile memory 435 are data coupled together by the ICM 410.

The ICM 410 is also communicatively coupled to a set of digital-to-parameters (DTOP) circuits 450-1 to 450-N via a digital bus 440 (e.g., a peripheral interface bus (PIB)). The DTOP circuits 450-1 to 450-N are coupled to analog circuits 460-11/460-1L to 460-N1/460-NK, respectively. In this case, as the arithmetic functions are performed in the TCU 470 and the target and error values are stored in RAMs 475 and 480, the DTOP circuits 450-1 to 450-N only include registers 452-11/452-1L to 452-N1/452-NK to hold the resulting trim values for adjusting corresponding parameters of analog circuits 460-11/460-1L to 460-N1/460-NK, respectively.

In operation, the user interface 415 provides an initiating command (1) to the WXE 420 to cause the WXE 420 to read target data from the RAM 422 and write the target data to the target RAM 4752 via the TCU 470. Based on the target data and associated data in global registers 485, the TCU 470 generates trim results and sends them (1) to the result registers 452-11/452-1L to 452-N1/452-NK of DTOP circuits 450-1 to 450-N, respectively.

During testing or calibration, the calibration engine 425 receives the target values (2) from the RAM 422 via the WXE 420, performs performance measurements of the analog circuits 460-11/460-1L to 460-N1/460-NK, and writes error values (2) to the error RAM 480 via the TCU 470. Based on the target and error data, and associated data in global registers 485, the TCU 470 generates trim results and sends them (2) to the result registers 452-11/452-1L to 452-N1/452-NK of DTOP circuits 450-1 to 450-N, respectively. The process of performing measurements, generating new error data, and writing the error data to the TCU 470 may be repeated as needed to achieve a desired performance for the analog circuits 460-11/460-1L to 460-N1/460-NK.

Once calibration is complete, the trim engine 430 collects all of the error data (3) from the error RAM 480, organizes the error data in a very efficient manner, and burns the error data (3) in the non-volatile memory 435. The trim engine 430 also reads the error data (3) from the non-volatile memory 435 and writes it into the error RAM 480 via the TCU 470 as needed.

As discussed in more detail further herein, the TCU 470 fetches the required data (e.g., target, error, and global data) and performs all arithmetic functions on the fly or in an in-line calculation manner. For example, the TCU 470 receives a command (e.g., in the form of an input address) from the WXE 420 or other device coupled to the ICM 410. Based on this command, the TCU 470 accesses associated target and error data from RAMs 475 and 480 (as well as any associated global data from registers 485), configures a programmable ALU array to perform a defined arithmetic operation on the operands (e.g., target, error, and associated global data) to generate a trim result, and sends the trim result to a defined register coupled to the analog circuit to which the trim operation is being performed.

Since all the target and error data is stored in RAMs 475 and 480 and all arithmetic operations are performed by the TCU 470, the apparatus 200 utilizes IC area more efficiently, is easily expandable by adding more RAM and address mapping to operands, arithmetic operations, and result address, and facilitates adding new and more complex arithmetic operations. The aforementioned concepts regarding the TCU 470 are discussed in more detail with reference to the following exemplary embodiments.

Figures 5A, 5B:
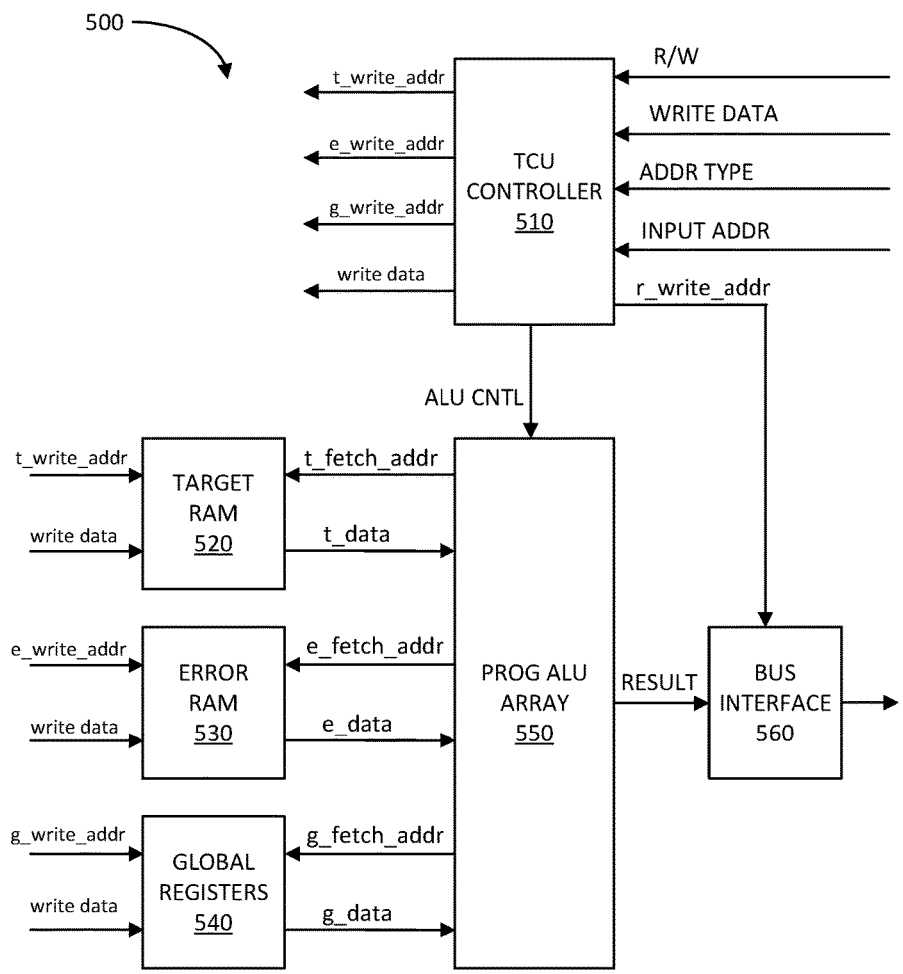
FIG. 5A illustrates a block diagram of an exemplary trim calculation unit (TCU) and associated memory devices in accordance with another aspect of the disclosure.
FIG. 5B illustrates a table for mapping various associated control signals for controlling the operations of the TCU in accordance with another aspect of the disclosure.

FIG. 5A illustrates a block diagram of an exemplary trim calculation unit (TCU) 500 including a target RAM 520, error RAM 350, and global registers 540 in accordance with another aspect of the disclosure. The TCU 500 may be an exemplary detailed implementation of the TCU 470 previously discussed. The TCU 500 includes a TCU controller 510, a programmable ALU array 550, and a bus interface 560. The programmable ALU array 550 is coupled to the target RAM 520, error RAM 530, and global registers 540.

The TCU controller 510 receives various signals from other devices via the ICM 410 for performing a trim read or write operation, associated trim computation, and transmission of the trim result to the appropriate result register. In this regard, the TCU controller 510 may receive: (1) a read/write (R/W) signal indicating whether a requested operation is a read or write operation; (2) a write data (e.g., a target data, error data, or global data) to be written into the corresponding memory device (e.g., target RAM 520, error RAM 530, and global registers 540); (3) an address type signal indicating the type of the write data (e.g., target, error, or global data) to which the requested operation pertains; and (4) the input address identifying the memory location to or from which the write or read operation is to be performed.

Based on these received signals, the TCU controller 510 may generate write data, a target write address (t_write_addr), an error write address (e_write_addr), a global register address (g_write_addr), an ALU control signal, and a result address (r_write_addr). The write data includes the data (e.g., target, error, or global) to be written into the memory device and location identified by the address type and input address.

The global register address (g_write_addr) identifies one of the global registers 540 to or from which data is written or read. The target address (t_write_addr) identifies a memory location in the target RAM 520 to or from which data is written or read. The error address (e_write_addr) identifies one or more memory locations in the error RAM 530 to and/or from which data is written or read. With regard to error data, the input address may include an offset to identify one of a set of associated error data to which the write data overwrites.

The ALU control signal programs the programmable ALU array 550 to perform the specified arithmetic on the fetched operands (e.g., target data, one or more error data, one or more global data) to generate a trim result. The result address (r_write_addr) instructs the bus interface 560 to send the trim result to the result register identified by the result address.

FIG. 5B illustrates a table for mapping an input address to a set of control signals for accessing the associated operands, programming the programmable ALU array, and sending the trim result to the appropriate result register in accordance with another aspect of the disclosure. The table includes a first column (from left) identifying a set of target addresses t_addr_1 to t_addr_j, a second column identifying a set of associated error addresses e_addr_1 to e_addr_j, a third column identifying the error block size (number of associated error operands or data), a fourth column identifying a set of associated global registers Null, g_addr_1, Null, to g_addr_2, a fifth column identifying a set of associated ALU programs 1, 3, 1 to 2, and a set of associated result addresses r_addr_1 to r_addr_j. The use of the table is described below with reference to exemplary methods for performing trim read and writes operations.

Figure 6A:
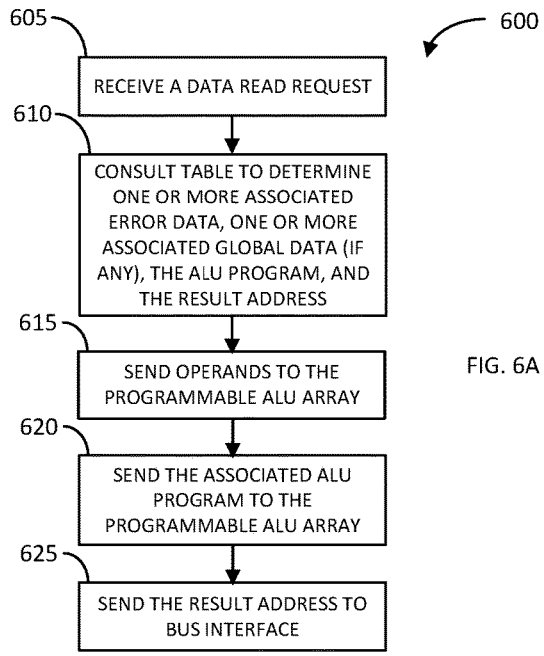
FIG. 6A illustrates a flow diagram of an exemplary method of performing a read trim operation in accordance with another aspect of the disclosure.

FIG. 6A illustrates a flow diagram of an exemplary method 600 of performing a trim read operation in accordance with another aspect of the disclosure. The method 600 may be implemented in the TCU controller 510.

The method 600 includes the TCU controller 510 receiving a data read request (block 605). The data read request includes an R/W signal indicating a read operation and an input target address.

In response to receiving the data read request, the TCU controller 510 consults the table of FIG. 5B (or performs other equivalent operations) to identify one or more associated error data, one or more associated global data (if any), an associated ALU program, and an associated result address (block 610). For example, with further reference to FIG. 5B, if the input address points to target address t_addr_1, the TCU controller 510 determines e_addr_1 as the only associated error address as block size is one (1), that there are no associated global registers as it is indicated as being NULL, Program 1 as the associated ALU program, and r_addr_1 as the associated result address.

After identifying the operands for the programmable ALU array 550, the TCU controller 510 causes the transfer (fetch) of the associated operands from the target RAM 520, error RAM 530, and global registers 540 (if applicable) to the programmable ALU array 550 (block 615). The TCU controller 510 may perform this operation by configuring the ALU CNTL signal so that the programmable ALU array 550 generates the appropriate target fetch address (t_fetch_addr), error fetch address (e_fetch_addr) and size, and global register address (g_fetch_addr) (if applicable) to cause the target RAM 520, error RAM 530, and global registers 540 to transfer the operands to the programmable ALU array 550.

The TCU controller 510 also configures the ALU control signal to identify the program that sets the programmable ALU array 550 to perform the associated arithmetic operation (block 620). In response to the ALU control signal identifying the program, the programmable ALU array 550 performs the specified arithmetic operation to generate a trim result. The TCU controller 510 also sends the associated result address (r_write_addr) to the bus interface 560 so that the bus interface sends the trim result to the appropriate result register (block 625).

Figure 6B:
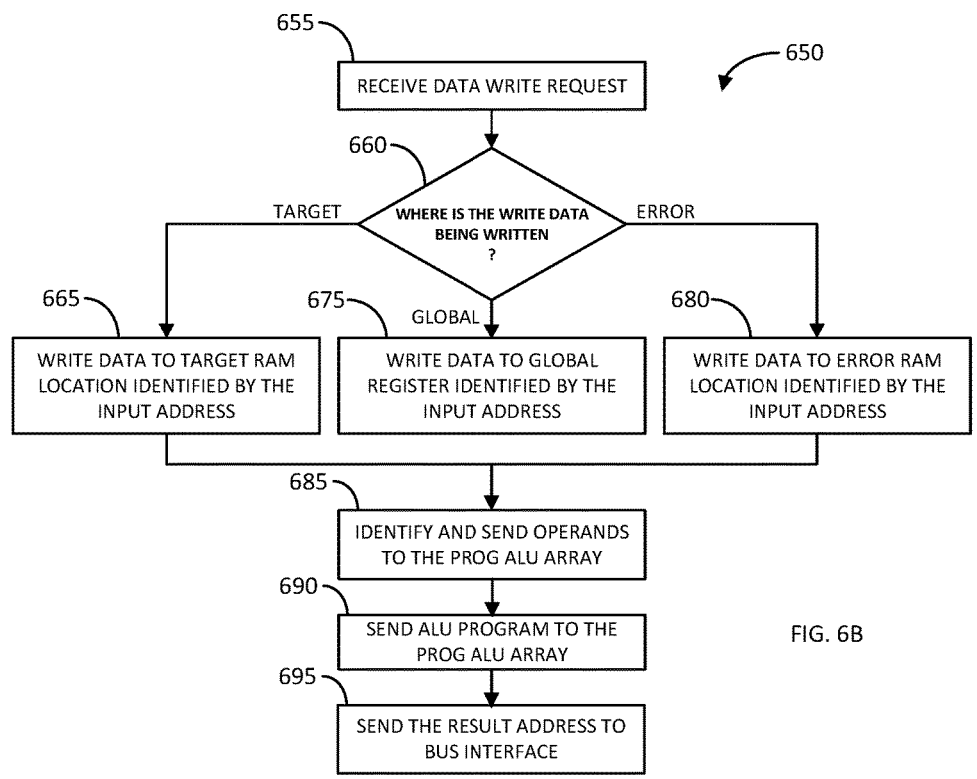
FIG. 6B illustrates a flow diagram of an exemplary method of write trim operation in accordance with another aspect of the disclosure.

FIG. 6B illustrates a flow diagram of an exemplary method 650 of performing a trim write operation in accordance with another aspect of the disclosure. The method 650 may be implemented in the TCU controller 510.

The method 650 includes the TCU controller 510 receiving a data write request (block 655). The data write request includes an R/W signal indicating a write operation, the write data, the address type selecting the target RAM 520, error RAM 530, or global register 540 as the destination of the write operation, and the input address identifying the memory location within the selected target RAM, error RAM, or global register.

If, based on the address type, the TCU controller 510 determines that the target RAM 520 is the destination of the write operation (block 660), the TCU controller causes the write data to be written into the target RAM at the memory location identified by the input address (block 665). The TCU controller 510 may perform this operation by sending the write data and target address (t_write_addr) to the target RAM 520 so that the write data is written into the memory location identified by the input address.

If, based on the address type, the TCU controller 510 determines that one of the global registers 540 is the destination of the write operation (block 660), the TCU controller causes the write data to be written into the global register 540 identified by the input address (block 675). The TCU controller 510 may perform this operation by sending the write data and global address (g_write_addr) to the global registers 540 so that the write data is written into the particular register identified by the input address.

If, based on the address type, the TCU controller 510 determines that the error RAM 530 is the destination of the write operation (block 660), the TCU controller causes the write data to be written into the error RAM at the memory location identified by the input address (block 680). The TCU controller 510 may perform this operation by sending the write data and error address (e_write_addr) to the error RAM 530 so that the write data is written into the memory location identified by the input address.

In the case of writing data to the target RAM 520 or the error RAM 530, the method 650 further includes the TCU controller 510 consulting the table of FIG. 5B (or performing an equivalent operation) to identify and cause the transfer (via the ALU CNTL signal indicating the fetch address) of the associated operands from the target RAM 520, error RAM 530, and global registers 540 (if applicable) to the programmable ALU array 550 (block 685). For example, with further reference to the table, if new target data is written into the target RAM 520 at target address t_addr_j pursuant to block 665, the new target data, three (3) associated error data at address e_addr_j, and an associated global data at global address g_addr_2 are sent to the programmable ALU array 550. Considering another example, if new error data is written into the error RAM at error address e_addr_2 pursuant to block 680, the associated target data at target address t_addr_2, the new error data and the other five (5) associated error data at error address e_addr_2, and an associated global data at global address g_addr_1 are sent to the programmable ALU array 550.

The TCU controller 510 also configures the ALU control signal to identify the program that sets the programmable ALU array 550 to perform the associated arithmetic operation (block 690). In response to the ALU control signal identifying the program, the programmable ALU array 550 performs the specified arithmetic operation on the set of operands to generate a trim result. The TCU controller 510 also sends the associated result address (r_write_addr) to the bus interface 560 so that the bus interface sends the trim result to the appropriate result register (block 695).

Figure 7A:
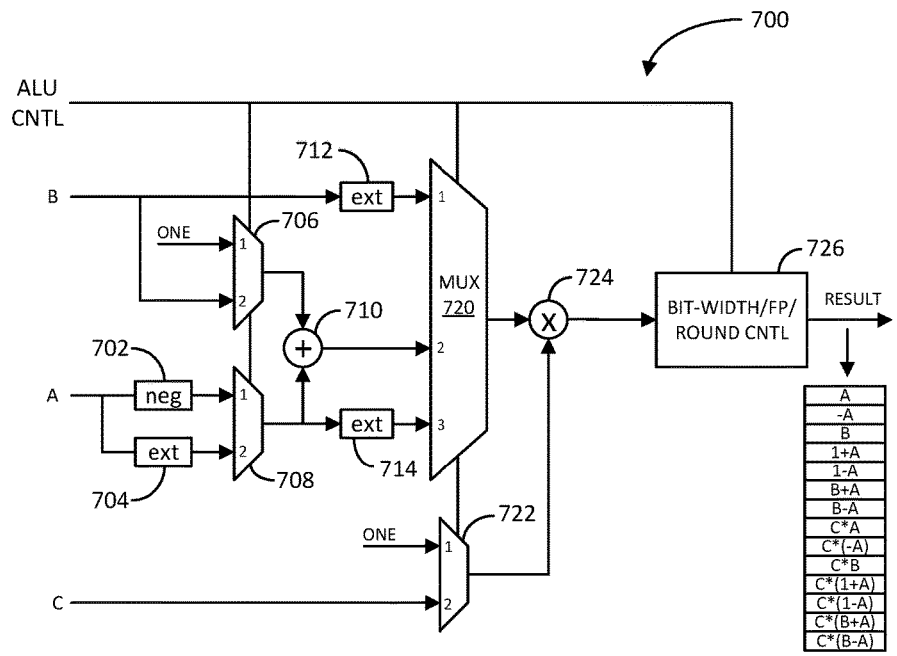
FIG. 7A illustrates a block diagram of an exemplary programmable ALU in accordance with another aspect of the disclosure.

FIG. 7A illustrates a block diagram of an exemplary programmable ALU 700 in accordance with another aspect of the disclosure. The programmable ALU 700 is a specific example of an ALU component of the programmable ALU array 550 previously discussed. In this example, the programmable ALU 700 accepts three (3) operands: A, B, and C, and generates a trim result based on any one or more of the operands A, B, and C and the ALU control signal indicating the specific ALU program. As indicated, the trim result may include the following: A, −A, B, 1+A, 1−A, B+A, B−A, C*A, C*(−A), C*B, C*(1+A), C*(1−A), C*(B+A), and C*(B−A).

In particular, the programmable ALU 700 includes a sign changing device (neg) 702, a first extension device 704, a first multiplexer 706, a second multiplexer 708, a combinational adder 710, a second extension device 712, a third extension device 714, a third multiplexer 720, a fourth multiplexer 722, and a bit-width/floating point/rounding controlling device 726.

The operand A is applied to inputs of the sign changing device (neg) 702 and the first extension device 704. The sign changing device (neg) 702 and first extension device 704 includes outputs coupled to first and second inputs of the second multiplexer 708, respectively. The operand B is applied to an input of the second extension device 712 and a second input of the first multiplexer 706. The first multiplexer 706 includes a first input configured to receive a constant number, such as one (1). The first and second multiplexers 706 and 708 include outputs coupled to inputs of the combinational adder 710, respectively. The output of the second multiplexer 708 is also coupled to an input of the third extension device 714. The second and third extension devices 712 and 714 and the combinational adder 710 include outputs coupled to first, second, and third inputs of the third multiplexer 720, respectively.

The operand C is applied to second input of the fourth multiplexer 722. Another constant, such as one (1), is applied to a first input of the fourth multiplexer 722. The third and fourth multiplexers 720 and 722 include outputs coupled to inputs of the combinational multiplier 724, respectively. The combinational multiplier 724 includes an output coupled to the bit-width/floating point/rounding controlling device 726. The bit-width/floating point/rounding controlling device 726 includes an output configured to produce the trim result. The multiplexers 706, 708, 720, and 722 and the bit-width/floating point/rounding controlling device 726 include control inputs configured to receive the ALU control signal for setting up the programmable ALU 700.

Just to describe a couple of examples, if the programmable ALU 700 is programmed to output B+A, the ALU control signal is configured to control the first multiplexer 706 to select its second input, and control the second multiplexer 704 to select its second input. This causes operands B and A to be applied to the combinational adder 710, which outputs B+A. The ALU control signal controls the third multiplexer 720 to select its second input so that it outputs B+A. The ALU control signal controls the fourth multiplexer 722 to select its first input so that it outputs one (1). Thus, the combinational multiplier 724 then outputs 1*(B+A). The resulting product B+A is then routed to the bit-width/floating point/rounding controlling device 726. As previously discussed, the bit-width/floating point/rounding controlling devices control the bit-width, floating point, and rounding of the numbers generated by the programmable ALU 700, as desired.

If the programmable ALU 700 is programmed to output C*(1−A), the ALU control signal is configured to control the first multiplexer 706 to select its first input, and control the second multiplexer 708 to select its first input. This causes the number one (1) and operand −A to be applied to the combinational adder 710, which outputs 1−A. The ALU control signal controls the third multiplexer 720 to select its second input so that it outputs 1−A. The ALU control signal controls the fourth multiplexer 722 to select its second input so that it outputs the operand C. Thus, the combinational multiplier 724 then outputs C*(1−A). The resulting product C*(1−A) is then routed to the bit-width/floating point/rounding controlling device 726. Other operations, as indicated by the included table, may be performed based on the program specified by the ALU control signal.

As discussed, the programmable ALU 700 is merely an example that is capable of performing operations based on one or more of the operands A, B, C to generate the possible outcomes as indicated in the included table. It shall be understood that the programmable ALU 700 may be configured to perform any number of selectable operations, including the addition and multiplication as exemplified, but also other operations, such as division, trigonometric operations, logarithmic operations, and others. The programmable ALU 700 may also use a look-up-table (LUT) to perform some or all of the programmable operations. The use of combinational arithmetic components including an LUT allows the programmable ALU 700 to generate the trim result at a high data rate, such as one (1) per clock cycle.

Figure 7B:
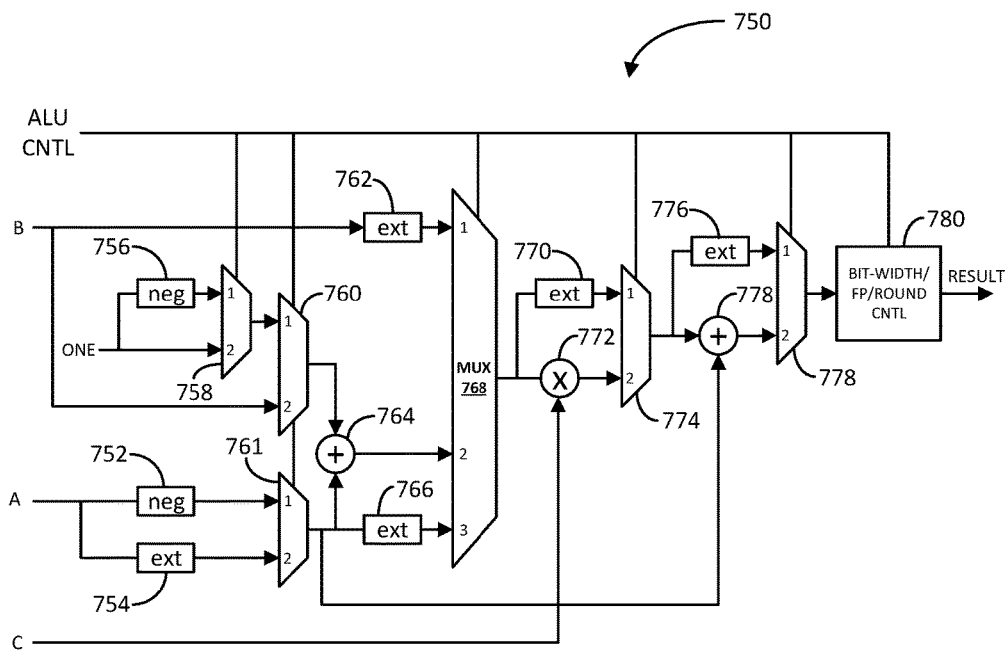
FIG. 7B illustrates a block diagram of another exemplary programmable ALU in accordance with another aspect of the disclosure.

FIG. 7B illustrates a block diagram of another exemplary programmable ALU 750 in accordance with another aspect of the disclosure. The programmable ALU 750 may be an alternative or additional specific example of an ALU component of the programmable ALU array 550 previously discussed. In this example, the programmable ALU 750 accepts three (3) operands: A, B, and C, and generates a trim result based on any one or more of the operands A, B, and C and the ALU control signal indicating the specific ALU program.

In particular, the programmable ALU 750 includes first and second sign changing devices (neg) 752 and 756, a first extension device 754, a first multiplexer 758, second and third multiplexers 760 and 761, a second extension device 762, a first combinational adder 764, a third extension device 766, a fourth multiplexer 768, a combinational multiplier 772, a fourth extension device 770, a fifth multiplexer 774, a second combinational adder 778, a fifth extension device 776, a fifth multiplexer 778, and a bit-width/floating point/rounding controlling device 770.

The operand A is applied to inputs of the first sign changing device (neg) 752 and the first extension device 754. The sign changing device (neg) 752 and first extension device 754 includes outputs coupled to first and second inputs of the third multiplexer 761, respectively. The operand B is applied to an input of the second extension device 762 and a second input of the second multiplexer 760. The second sign changing device (neg) 756 includes an input to receive a constant number, such as one (1). The output of the second sign changing device 758 is coupled to a first input of the second multiplexer 760. The second multiplexer 760 includes a second input configured to receive the constant number one (1).

The second and third multiplexers 760 and 761 include outputs coupled to inputs of the first combinational adder 764, respectively. The output of the third multiplexer 761 is also coupled to an input of the third extension device 766. The second and third extension devices 762 and 766 and the combinational adder 764 include outputs coupled to first, second, and third inputs of the fourth multiplexer 768, respectively.

The output of the fourth multiplexer 768 is coupled to a first input of the combinational multiplier 772 and an input of the fourth extension device 770. The operand C is applied to a second input of the combinational multiplier 772. The fourth extension device 770 and the combinational multiplier 772 include outputs coupled to first and second inputs of the fifth multiplexer 774, respectively.

The output of the fifth multiplexer 774 is coupled to a first input of the second combinational adder 778 and an input of the fifth extension device 776. The output of the third multiplexer 761 is coupled to a second input of the second combinational adder 778. The fifth extension device 776 and the second combinational adder 778 include outputs coupled to first and second inputs of the sixth multiplexer 778, respectively.

The sixth multiplexer 778 includes an output coupled to the bit-width/floating point/rounding controlling device 780. The bit-width/floating point/rounding controlling device 780 includes an output configured to produce the trim result. The multiplexers 758, 760, 761, 768, 774, and 778 and the bit-width/floating point/rounding controlling device 780 include control inputs configured to receive the ALU control signal for setting up the programmable ALU 750.

The programmable ALU 750 is configured to produce at least the following available operations:

| | | | |
|---|---|---|---|
| A | C * A | A + A | A + (C * A) |
| (−A) | C * (−A) | A − [(−A)] | A + [C * (−A)] |
| B | C * B | A + (B) | A + (C * B) |
| 1 + A | C * (1 + A) | A + (1 + A) | A + [C * (1 + A)] |
| 1 − A | C * (1 − A) | A + (1 − A) | A + [C * (1 − A)] |
| A − 1 | C * (A − 1) | A + (A − 1) | A + [C * (A − 1)] |
| (−A) − 1 | C * [(−A) − 1] | A + [(−A) − 1] | A + [C * [(−A) − 1)] |
| B + A | C * (B + A) | A + (B + A) | A + [C * (B + A)] |
| B − A | C * (B − A) | A + (B − A) | A + [C * (B − A)] |

Figure 8:
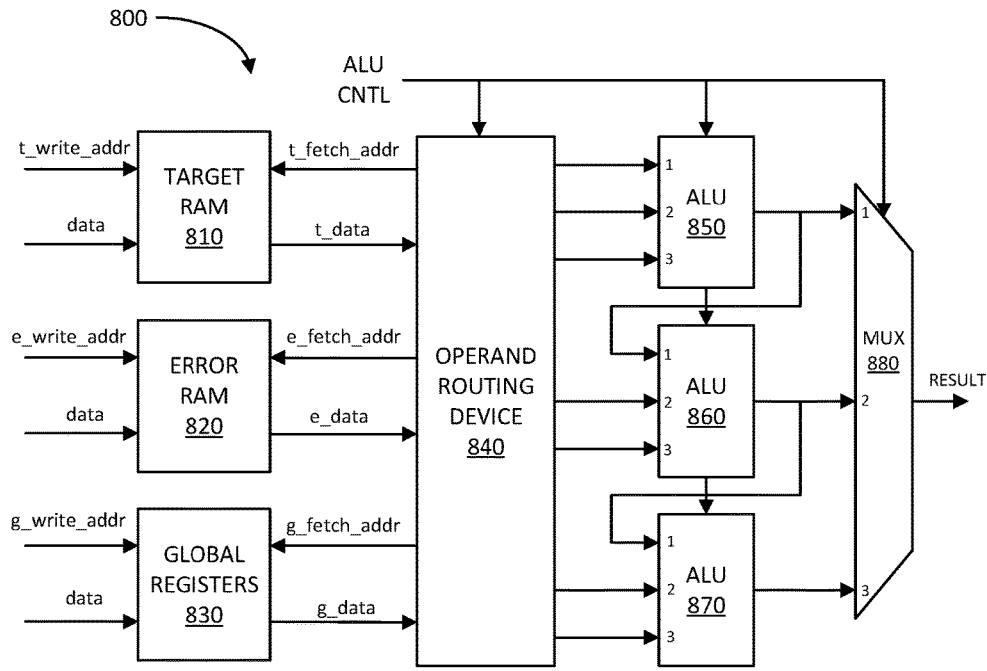
FIG. 8 illustrates a block diagram of an exemplary programmable ALU array and associated memory devices in accordance with another aspect of the disclosure.

FIG. 8 illustrates a block diagram of an exemplary programmable ALU array 800 and associated target RAM 810, error RAM 820, and global registers 830 in accordance with another aspect of the disclosure. The programmable ALU array 800 may be an exemplary detailed implementation of the programmable ALU array 550 previously discussed. The programmable ALU array 800 employs a pipeline approach, where one (or more) ALU produces an intermediate value, which is applied to the input of another ALU, which, in turn, may produce another intermediate value (for processing by yet another ALU) or the trim result.

In particular, the programmable ALU array 800 includes an operand routing device 840, a set of programmable ALUs 850, 860, and 870, and a multiplexer 880. Although three (3) programmable ALUs 850, 860, and 870 are depicted for description purposes, it shall be understood that the programmable ALU array 800 may include any number of programmable ALUs.

The operand routing device 840 includes inputs configured to receive the fetched target data (t_data) by generating a target fetch request (t_fetch_addr), the fetched one or more error data (e_data) by generating an error fetch request (e_fetch_addr), and the fetched one or more global data (g_data) (if any) by generating a global fetch request (g_fetch_addr) from the target RAM 810, error RAM 820, and global registers 830, respectively. Based on the ALU control signal, the operand routing device 840 may route such operands to any of the inputs of the programmable ALUs 850, 860, and 870. As an example, if the programmable ALU 850 is the only ALU that performs an arithmetic operation based on the ALU control signal, the operand routing device 840 may route a target data (t_data), an error data (e_data), and a global data (g_data) to inputs three (3), one (1), and two (2) of the programmable ALU 850. As another example, if all programmable ALUs 850, 860, and 870 are used to perform the arithmetic operation based on the ALU control signal, the operand routing device 840 may route the target data (t_data) to input three (3) of ALU 870; five (5) associated error data (e_data) to inputs one (1) and three (3) of ALU 850, inputs two (2) and three (3) of ALU 860, and input two (2) of ALU 870; and an associated global data (g_data) to input two (2) of ALU 850.

Each of the programmable ALUs 850, 860, and 870 may be configured similar to programmable ALU 700 or 750 previously discussed. Alternatively, each of the programmable ALUs may be configured to perform another set of arithmetic operations. The programmable 850, 860, and 870 may all be configured to be the same (to generate the same set of arithmetic operations), or may be configured different from each other (to generate different sets of available arithmetic operations). Further, although in this example, each of the programmable ALUs 850, 860, and 870 include three inputs, it shall be understood that each of the ALUs may include any number of inputs.

In this example, the programmable ALUs 850, 860, and 870 are cascaded (as in a pipeline). That is, the programmable ALU 850 includes an output coupled to the first input of programmable ALU 860, and the programmable ALU 860 includes an output coupled to the first input of programmable ALU 870. The outputs of programmable ALUs 850, 860, and 870 are coupled to first, second, and third inputs of the multiplexer 880. The multiplexer 880 includes an output configured to produce the trim result. The operand routing device 840, the programmable ALUs 850, 860, and 870, and multiplexer 880 include respective control inputs for receiving the ALU control signal for programming the specific arithmetic operation of the programmable ALU array 800.

If the ALU 850 is the only ALU required to perform the arithmetic operation, the ALU 850 outputs the trim result. In this case, the multiplexer 880 selects its first input based on the ALU control signal to output the trim result from the output of ALU 850. Similarly, if the ALUs 850 and 860 (but not ALU 870) are required to perform the arithmetic operation, the ALU 860 outputs the trim result. In this case, the multiplexer 880 selects its second input based on the ALU control signal to output the trim result from the output of ALU 860. In a like manner, if all the ALUs 850, 860, and 870 are required to perform the arithmetic operation, the ALU 870 outputs the trim result. In this case, the multiplexer 880 selects its third input based on the ALU control signal to output the trim result from the output of ALU 870.

By cascading the ALUs 850, 860, and 870, a large number and more complex arithmetic operations may be available. As an example, if each of the ALUs 850, 860, and 870 are configured to generate the same set of arithmetic operations as ALU 700, the total number of arithmetic operations may be as much as 2744 or $14^3$ (where each of the ALUs can perform 14 different operations). As one example, operands A, B, C, D, E, F, and G may be applied to the first three inputs of ALU 850, the second and third inputs of ALU 860, and the second and third inputs of ALU 870. If ALU 850 is programmed to perform C*(1+A) operation, ALU 860 is programmed to perform C*(B+A) operation, and ALU 870 is programmed to perform C*(B−A) operation, then the trim result is based on the following equation:

$$\text{Trim Result} = G*(F-E*(D+C*(1+A)))$$

As this example illustrates, the cascading of ALUs 850, 860, and 870 may be configured to perform numerous complex arithmetic operations.

Figure 9:
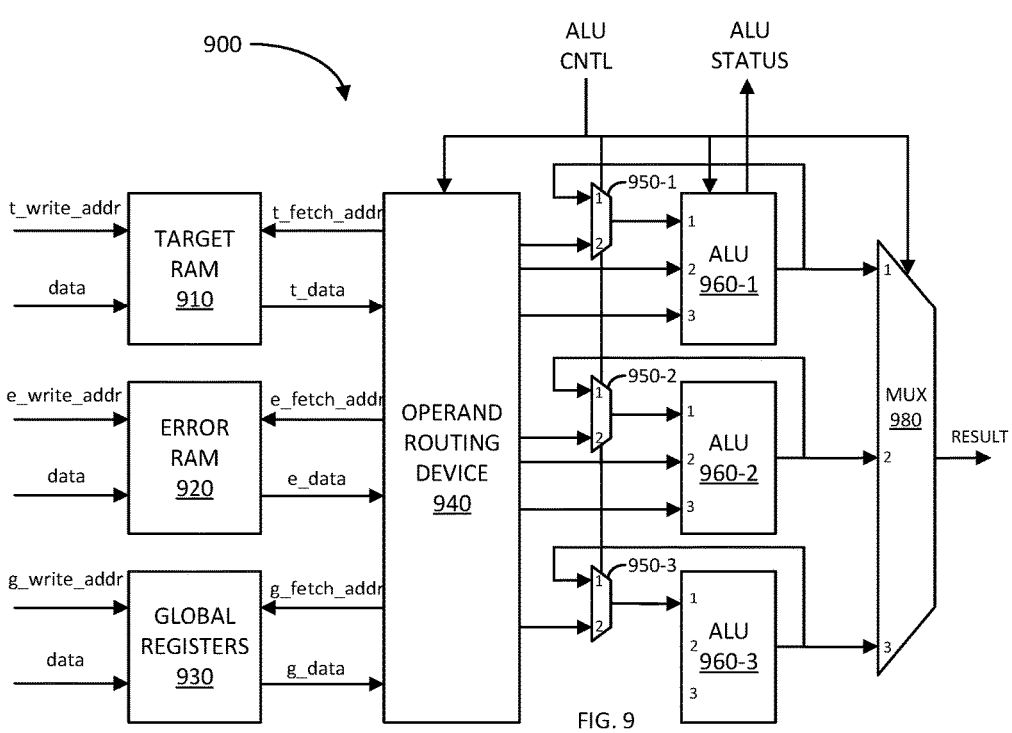
FIG. 9 illustrates a block diagram of another exemplary programmable ALU array and associated memory devices in accordance with another aspect of the disclosure.

FIG. 9 illustrates a block diagram of another exemplary programmable ALU array 900 and associated target RAM 910, error RAM 920, and global registers 930 in accordance with another aspect of the disclosure. The programmable ALU array 900 may be another exemplary detailed implementation of the programmable ALU array 550 previously discussed. In contrast to the pipeline approach, the programmable ALU array 900 includes a set of ALUs to be operated independently of each other.

In particular, the programmable ALU array 900 includes an operand routing device 940, a set of multiplexers 950-1 to 950-3, a set of programmable ALU 960-1 to 960-3, and an output multiplexer 980. As in the previous embodiment, the operand routing device 940 includes inputs configured to receive the fetched target data (t_data) by generating a target fetch request (t_fetch_addr), the fetched one or more error data (e_data) by generating an error fetch request (e_fetch_addr), and the fetched one or more global data (g_data) (if any) from the target RAM 910 by generating a global fetch request (g_fetch_addr) from the target RAM 910, error RAM 920, and global registers 930, respectively.

The operand routing device 940 includes outputs coupled to respective second inputs of the multiplexers 950-1, 950-2, and 950-3, and respective second and third inputs of programmable ALUs 960-1, 960-2, and 960-3. The programmable ALUs 960-1, 960-2, and 960-3 include respective outputs coupled to respective first inputs of the multiplexers 950-1, 950-2, and 950-3, wherein one of the outputs is configured to produce the trim result per iteration. The multiplexers 950-1 to 950-3 include respective outputs coupled to respective first inputs of the programmable ALUs 960-1 to 960-3. The outputs of the programmable ALUs 960-1 to 960-3 are coupled to first, second, and third inputs of the output multiplexer 980. The operand routing device 940, multiplexers 950-1 to 950-3, programmable ALUs 960-1 to 960-3, and output multiplexer 980 include control inputs for receiving the ALU control signal for receiving the program information.

In this exemplary embodiment, the trim result may be generated based on multiple iterations of arithmetic operations performed by each of the programmable ALUs 960-1 to 960-3. For instance, in a first iteration, the operand routing device 940 may receive a first subset of operands from any of the target RAM 910, error RAM 920, and global registers 930. Based on the specified program, the operand routing device 940 may route the first subset of operands to the second input of the multiplexer 950-1 and second and third inputs of the programmable ALU 960-1. In the first iteration, the ALU control signal controls the multiplexer 950-1 to select its second input so that the first subset of operands is applied to all inputs of the ALU 960-1. The programmable ALU 960-1 then performs a specified arithmetic operation on the first subset of operands to generate an intermediate trim value.

During a second iteration, the operand routing device 940 may receive a second subset of operands from any of the target RAM 910, error RAM 920, and global registers 930, and routes the second subset of operands to the second and third inputs of the programmable ALU 960-1. In the second iteration, the ALU control signal controls the multiplexer 950-1 to select its first input so that the intermediate trim value is applied to the first input of the ALU 960-1. The programmable ALU 960-1 then performs another specified arithmetic operation on the intermediate value and the second subset of operands to generate the final trim result or another intermediate trim value. In the case where it generates another intermediate trim value, the aforementioned process is repeated as necessary until the final trim result is generated.

The other ALUs 960-1 and 960-2 may perform a similar iterative process to independently generate a trim result. In this embodiment, the programmable ALUs 960-1 to 960-3 are heterogeneous and are configured to generate different sets of arithmetic operations, respectively. Thus, depending on the trim result arithmetic requirement, the operands may be sent to the ALU capable of performing the specified arithmetic operation. In some cases, the selected ALU is ALU 960-1. In other cases, the selected ALU is ALU 960-2. And, in yet other cases, the selected ALU is ALU 960-3.

Thus, similar to the programmable ALU array 800, the programmable ALU array 900 may be programmed to generate a large number of arithmetic operations based on the selected ALU and the number of iterations required to generate the final trim result. If configured with a single or a small number of ALUs, the programmable ALU array 900 has the advantage of requiring less IC area and power consumption compared to programmable ALU 800 since there may be only a single or fewer programmable ALUs. On the other hand, the programmable ALU 800 may generate the trim result faster as it may only require a single iteration, where the programmable ALU 900 may require multiple iterations.

Figure 10:
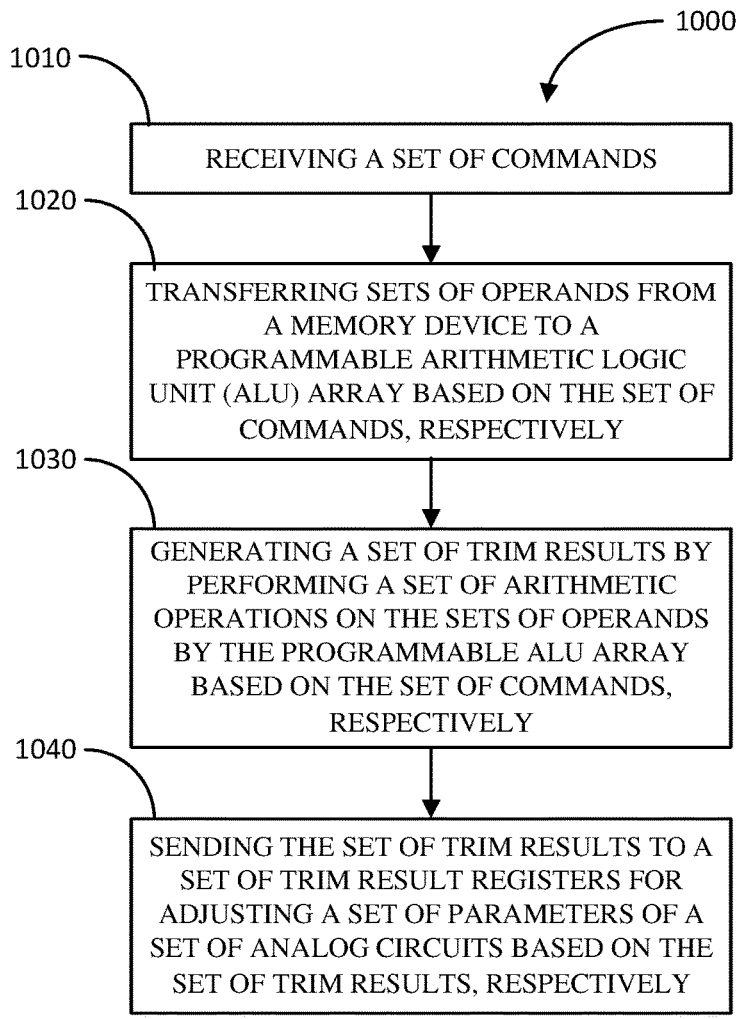
FIG. 10 illustrates a flow diagram of an exemplary method of performing trim operations of analog circuit parameters in accordance with another aspect of the disclosure.

FIG. 10 illustrates a flow diagram of an exemplary method 1000 of performing trim operations of analog circuit parameters in accordance with another aspect of the disclosure.

The method 1000 includes receiving a set of commands (block 1010). An example of means for receiving a set of commands includes the TCU controller 510 described herein.

The method 1000 further includes transferring sets of operands from a memory device to a programmable arithmetic logic unit (ALU) array based on the set of commands, respectively (block 1020). An example of a means for transferring sets of operands from a memory device to a programmable arithmetic logic unit (ALU) array based on the set of commands, respectively include the TCU controller 510 generating the control signals R/W CNTL and target address, error address, and global register address for effecting the aforementioned transfer of the operands.

The method 1000 further includes generating a set of trim results by performing a set of arithmetic operations on the sets of operands by the programmable ALU array based on the set of commands, respectively (block 1030). Examples of means for generating a set of trim results by performing a set of arithmetic operations on the sets of operands by the programmable ALU based on the set of commands, respectively, include programmable ALU array 550, the programmable ALU 700, the programmable ALU array 800, and the programmable ALU 900.

The method 1000 further includes sending the set of trim results to a set of trim result registers for adjusting a set of parameters of a set of analog circuits based on the set of trim results, respectively (block 1040). An example of a means for sending the set of trim results to a set of trim result registers for adjusting a set of parameters of a set of analog circuits based on the set of trim results, respectively, includes the bus interface 560.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
a set of trim result registers configured to store a set of trim results for adjusting a set of parameters of a set of analog circuits, respectively;
a memory device configured to store sets of operands associated with the set of trim results, respectively; and
a trim calculation unit configured to generate the set of trim results by performing a set of arithmetic operations on the sets of associated operands based on a set of commands, respectively, wherein the trim calculation unit comprises a programmable arithmetic logic unit (ALU) configured to perform the set of arithmetic operations based on the set of commands, respectively, and wherein the programmable ALU includes a set of ALUs configured to generate the trim result independently of each other.

2. The apparatus of claim 1, wherein the programmable ALU comprises a first set of one or more multiplexers configured to direct each set of operands to a set of one or more combinational arithmetic computation devices based on the corresponding command for generating the corresponding trim result.

3. The apparatus of claim 2, wherein the programmable ALU comprises a second set of one or more multiplexers configured to direct a set of one or more intermediate computational values resulting from one or more computations performed by the one or more combinational arithmetic computation devices on each set of operands based on the corresponding command for generating the corresponding trim result.

4. An apparatus, comprising:
a set of trim result registers configured to store a set of trim results for adjusting a set of parameters of a set of analog circuits, respectively;
a memory device configured to store sets of operands associated with the set of trim results, respectively; and
a trim calculation unit configured to generate the set of trim results by performing a set of arithmetic operations on the sets of associated operands based on a set of commands, respectively, wherein the trim calculation unit comprises:
a first programmable ALU including a first set of inputs configured to receive at least one of the set of operands or a first subset of the at least one set of operands based on the corresponding command;
a second programmable ALU including a second set of inputs configured to receive no operands of the at least one of the set of operands or a second subset of the at least one of the set of associated operands based on the corresponding command, wherein first programmable ALU includes a first output coupled to one of the second set of inputs of the second programmable ALU; and
a multiplexer including a set of inputs coupled to the first and second outputs of the first and second programmable ALUs, respectively;
wherein the first programmable ALU is configured to perform a first arithmetic operation on the at least one set of operands or the first subset of the at least one set of operands based on the corresponding command to generate a trim result or an intermediate value at the first output, respectively;
wherein the second programmable ALU is configured to perform a second arithmetic operation on the intermediate value and the second subset of the at least one set of operands based on the corresponding command to generate the trim result or another intermediate value at the second output; and
wherein the multiplexer is configured to couple one of the set of inputs to an output to generate the trim result at the output based on the corresponding command.

5. The apparatus of claim 4, further comprising an operand routing device configured to route the at least one of the set of operands from the memory device to the first set of inputs of the first programmable ALU or route the first and second subsets of the at least one set of operands from the memory to the first and second sets of inputs of the first and second programmable ALUs, respectively, based on the corresponding command.

6. The apparatus of claim 1, wherein at least one of the ALUs comprises a first set of inputs and a first output; and further comprising:
a multiplexer including a second output coupled to one of the first set of inputs of the at least one of the ALUs, and a second set of inputs including one input coupled to the first output of the at least one of the ALUs;
wherein the first set of inputs of the at least one of the ALUs is configured to receive a corresponding set of the operands including a first subset thereof via the multiplexer, and wherein the at least one of the ALUs is configured to perform an arithmetic operation on the corresponding set of operands to generate the corresponding trim result based on the corresponding command.

7. The apparatus of claim 6, further comprising an operand routing device configured to route the corresponding set of operands including the first subset from the memory device to the first set of inputs of the at least one of the ALUs and the multiplexer based on the corresponding command.

8. An apparatus, comprising:
a set of trim result registers configured to store a set of trim results for adjusting a set of parameters of a set of analog circuits, respectively;
a memory device configured to store sets of operands associated with the set of trim results, respectively; and
a trim calculation unit configured to generate the set of trim results by performing a set of arithmetic operations on the sets of associated operands based on a set of commands, respectively, wherein the trim calculation unit comprises:
a programmable ALU including a first set of inputs and a first output; and
a multiplexer including a second output coupled to one of the first set of inputs of the programmable ALU, and a second set of inputs including one input coupled to the first output of the programmable ALU;
wherein the first set of inputs of the programmable ALU is configured to receive a corresponding set of the operands including a first subset thereof via the multiplexer, and wherein the programmable ALU is configured to perform an arithmetic operation on the corresponding set of operands to generate the corresponding trim result based on the corresponding command; and
wherein the first set of inputs of the programmable ALU is configured to receive a second subset of the set of operands including the first subset during a first iteration, and wherein the programmable ALU is configured to perform a first portion of the arithmetic operation on the second subset of operands to generate a first intermediate value based on the corresponding command.

9. The apparatus of claim 8, wherein the first set of inputs of the programmable ALU is configured to receive the intermediate value via the multiplexer and a third subset of the set of operands during a second iteration, and wherein the programmable ALU is configured to perform a second portion of the arithmetic operation on the intermediate value and the third subset of operands to generate the corresponding trim result or a second intermediate value based on the corresponding command.

10. The apparatus of claim 9, further comprising an operand routing device configured to route the third subset of operands from the memory device to the first set of inputs of the programmable ALU during the second iteration based on the corresponding command.

11. An apparatus, comprising:
a set of trim result registers configured to store a set of trim results for adjusting a set of parameters of a set of analog circuits, respectively;
a memory device configured to store sets of operands associated with the set of trim results, respectively; and
a trim calculation unit configured to generate the set of trim results by performing a set of arithmetic operations on the sets of associated operands based on a set of commands, respectively, wherein the trim calculation unit comprises:
a programmable ALU;
a bus interface; and
a controller configured to:
receive the set of commands;
cause the sets of operands to be transferred from the memory device to the programmable ALU based on the set of commands, respectively;
cause the programmable ALU to perform the set of arithmetic operations on the sets of operands to generate the set of trim results based on the set of commands, respectively; and
cause the bus interface to transfer the set of trim results to the set of trim result registers based on the set of commands, respectively.

12. The apparatus of claim 1, wherein the sets of operands comprises a set of target data indicating default targets for the parameters of the set of analog circuits, respectively, and sets of error data for modifying the default targets based on the set of arithmetic operations to generate the trim results for adjusting the set of parameters of the analog circuits, respectively.

13. The apparatus of claim 12, wherein the memory device comprises:
a first memory configured to store the set of target data; and
a second memory configured to store the sets of error data.

14. The apparatus of claim 12, wherein the set of commands comprises a set of target addresses identifying a set of memory locations at which the set of target data are stored in the first memory.

15. The apparatus of claim 14, wherein the controller is configured to:
generate a set of error addresses identifying the sets of error data in the second memory based on the set of target addresses, respectively; and
cause the sets of operands to be transferred from the memory device to the programmable ALU based on the set of target and error addresses, respectively.

16. The apparatus of claim 14, wherein the controller is configured to generate a set of ALU control signals for causing the programmable ALU to perform the set of arithmetic operations on the sets of operands to generate the set of trim results based on the set of target addresses, respectively.

17. The apparatus of claim 14, wherein the controller is configured to generate a set of result addresses identifying the set of trim registers based on the set of target addresses, respectively, and wherein the bus interface is configured to transfer the set of trim results to the set of trim result registers based on the set of result addresses, respectively.

18. An apparatus, comprising:
a set of trim result registers configured to store a set of trim results for adjusting a set of parameters of a set of analog circuits, respectively;
a memory device configured to store sets of operands associated with the set of trim results, respectively; and
a trim calculation unit configured to generate the set of trim results by performing a set of arithmetic operations on the sets of associated operands based on a set of commands, respectively;
wherein the sets of operands comprises a set of target data indicating default targets for the parameters of the set of analog circuits, respectively, sets of error data for modifying the default targets based on the set of arithmetic operations to generate the trim results for adjusting the set of parameters of the analog circuits, respectively;
wherein the memory device comprises:
a first memory configured to store the set of target data; and
a second memory configured to store the sets of error data;
wherein the sets of operands further comprises at least one global data, wherein the memory device further comprises a third memory for storing the at least one global data.

* * * * *